United States Patent [19]

Halvorsen et al.

[11] 4,417,778
[45] Nov. 29, 1983

[54] CIRCUIT INTERLOCK ARRANGEMENT

[75] Inventors: Henry J. Halvorsen, Cranford; Albert V. Marchetto, Mountainside; Edwin P. Thomas, Brick, all of N.J.

[73] Assignee: Bell Telephone Laboratories, Incorporated, Murray Hill, N.J.

[21] Appl. No.: 314,244

[22] Filed: Oct. 23, 1981

[51] Int. Cl.³ ............................................. H01R 23/70
[52] U.S. Cl. ............................ 339/17 M; 339/75 MP; 339/91 R
[58] Field of Search ............ 339/17 LM, 17 M, 45 R, 339/45 M, 75 MP, 176 MP, 91 R; 361/413

[56] References Cited

U.S. PATENT DOCUMENTS

| | | | |
|---|---|---|---|
| 3,150,906 | 9/1964 | Chambon et al. | 339/45 M |
| 3,270,253 | 8/1966 | Binder et al. | 317/120 |
| 3,278,714 | 10/1966 | Bernutz | 361/413 |
| 3,537,063 | 10/1970 | Beaulieu | 339/74 |
| 3,594,699 | 7/1971 | Jayne et al. | 339/176 MP |
| 3,697,929 | 10/1972 | Konewko et al. | 339/176 MP |
| 3,767,974 | 10/1973 | Donovan, Jr. et al. | 339/17 LC |
| 3,778,753 | 12/1973 | Occhipinti et al. | 339/176 MP |
| 3,932,016 | 1/1976 | Ammenheuser | 339/75 MP |
| 3,952,232 | 4/1976 | Coules | 339/45 M |
| 4,069,403 | 1/1978 | Beaudette et al. | 361/413 |

FOREIGN PATENT DOCUMENTS 2433385 2/1975 Fed. Rep. of Germany ...... 361/413

OTHER PUBLICATIONS

*IBM Technical Disclosure Bulletin*, vol. 15, No. 8, Jan. 1973, "Low Insertion Force Connector-Circuit Card Actuated"; Doody.

*Primary Examiner*—John McQuade
*Attorney, Agent, or Firm*—John Francis Moran

[57] ABSTRACT

An interlock arrangement utilizes a modification of printing circuit boards (11 and 41) and spring loaded locking levers (23 and 24). One printed circuit board (11) includes notches or detents (25 and 26) in which the locking levers rest to prevent the removal of the board after being inserted into its connectors (13–15). In order to remove the board, another printed circuit board (41) is utilized which has tapered portions (42 and 43) that displace the locking pins from the detents in the process of being inserted into auxiliary connectors (44 and 46). Thus, the first board may be removed while the second board provides a predetermined circuitry status via the interconnection of the two sets of connectors.

6 Claims, 6 Drawing Figures

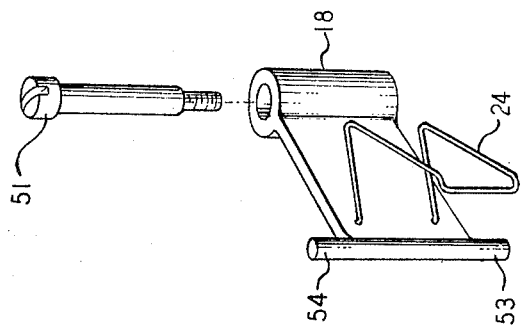
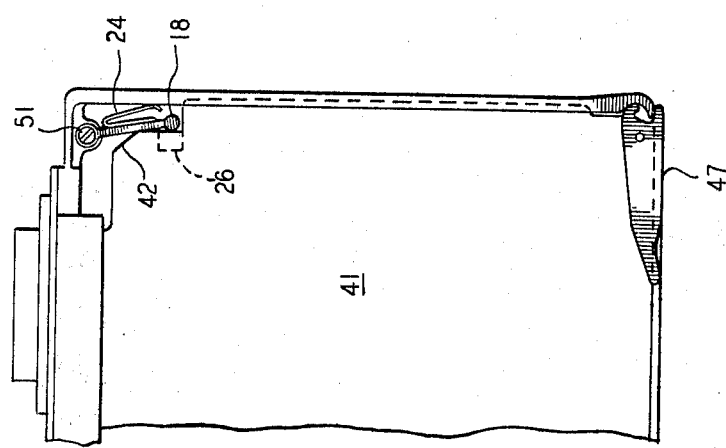
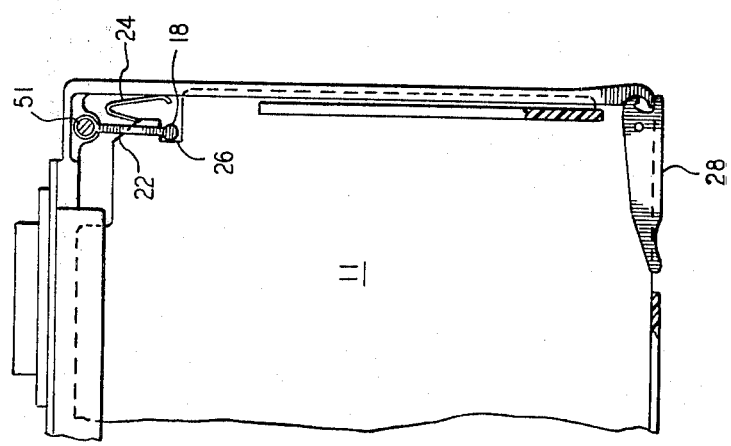

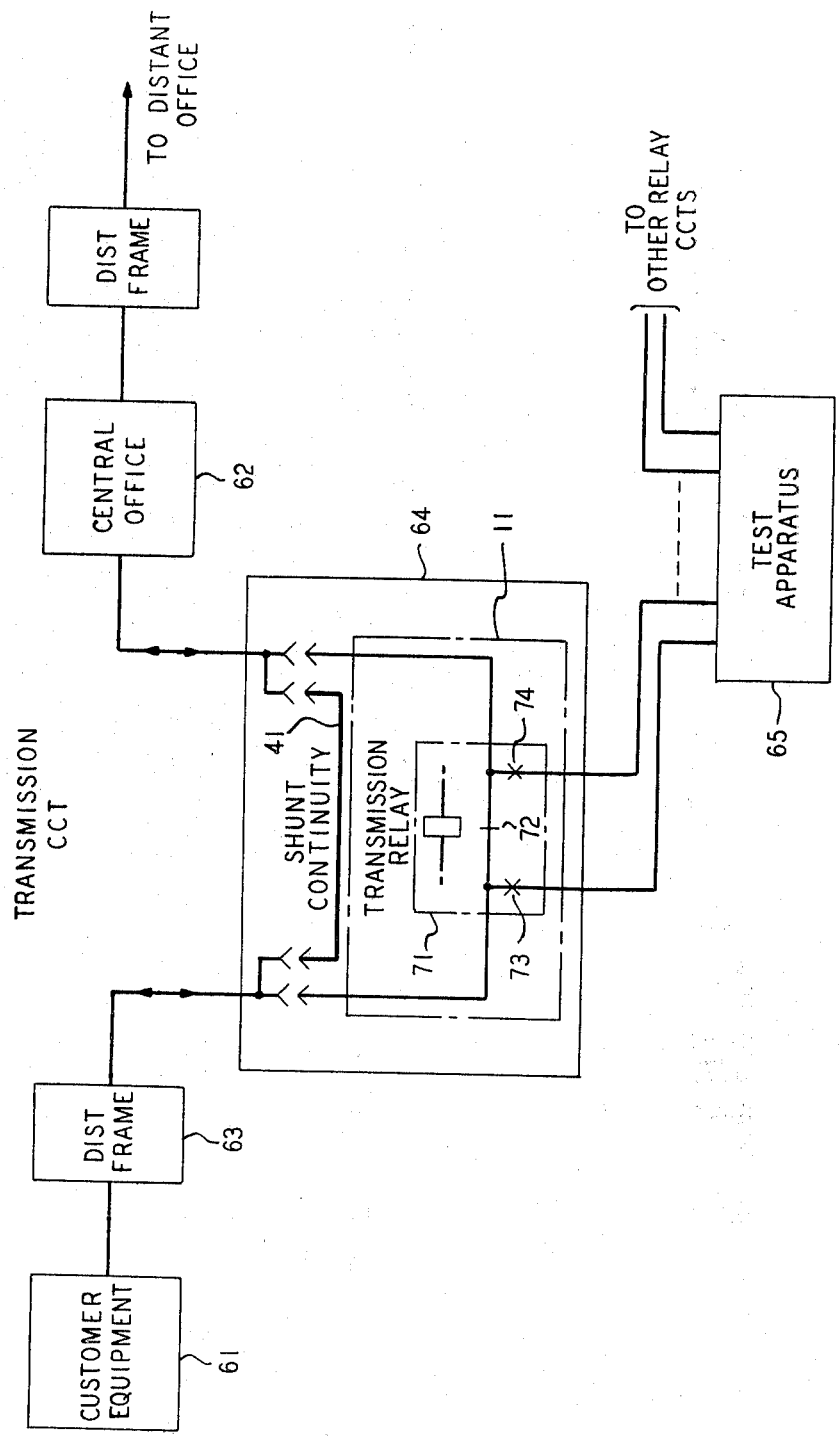

CIRCUIT INTERLOCK ARRANGEMENT

BACKGROUND OF THE INVENTION

This invention relates to versatile interlocking circuit and equipment packaging arrangements. More particularly, this invention relates to an interlocking arrangement which preserves a desired circuit status while permitting removal of circuits without interruption even though such circuits normally are essential in providing that level of circuitry status.

In certain applications, it is highly advantageous to provide a desired circuitry status regardless of other necessary activities. One such activity being the removal of circuits which are required to provide circuit continuity for separately testing these very circuits as a unit. For example, the transmission of communication signals via transmission paths is only one among many situations wherein uninterrupted circuit continuity is desirable. In existing telecommunications systems, the number of transmission paths are numerous so that any circuit arrangement associated with accessing or testing the paths must be economical. The large number of attendant connections in telecommunications applications also necessitates extremely high reliability. Furthermore, it would be desirable if such an arrangement were almost foolproof, so that accidental interruptions of circuit status are precluded from occurring. Other desirable features are compactness of size and ease of manufacturing and convenience of installation which become more significant as large numbers of circuit arrangements are required.

SUMMARY OF THE INVENTION

Broadly, the invention takes the form of an interlock arrangement wherein a first planar pluggable element is locked into its connector and permitted to be removed by using a second planar pluggable element adapted for insertion into an auxiliary connector.

An aspect of the invention is that the second planar pluggable element is capable of providing a predetermined circuitry status during the removal of the first planar pluggable element. Another aspect of the invention is that the first planar pluggable element includes a detent for engaging one end of a spring loaded pivoting lever to provide the locking function. The second planar pluggable element includes a tapered portion for removing the end of the pivoting lever from the detent while being inserted into an auxiliary connector in circuit with the connector of the first planar pluggable element. This displacement of the pivoting lever unlocks the first planar pluggable element so it may be unplugged. A second pivoting lever is adapted to engage a second detent on the first planar pluggable element. The second planar pluggable element has a second tapered portion for removing the second pivoting lever from the second detent.

BRIEF DESCRIPTION OF THE DRAWING

These and other objects and advantages of the invention may be more fully understood by consideration of the illustrative embodiment to be described in detail in conjunction with the accompanying drawing.

FIG. 3 shows a locking position of a locking pin in a corner of a circuit board that is fully inserted.

FIG. 4 illustrates the release position of the interlock using another circuit board.

FIG. 5 depicts a locking pin and associated spring for use in the interlock.

FIG. 6 represents an application of the inventive interlock in a telecommunications system.

DETAILED DESCRIPTION

Figure 1:
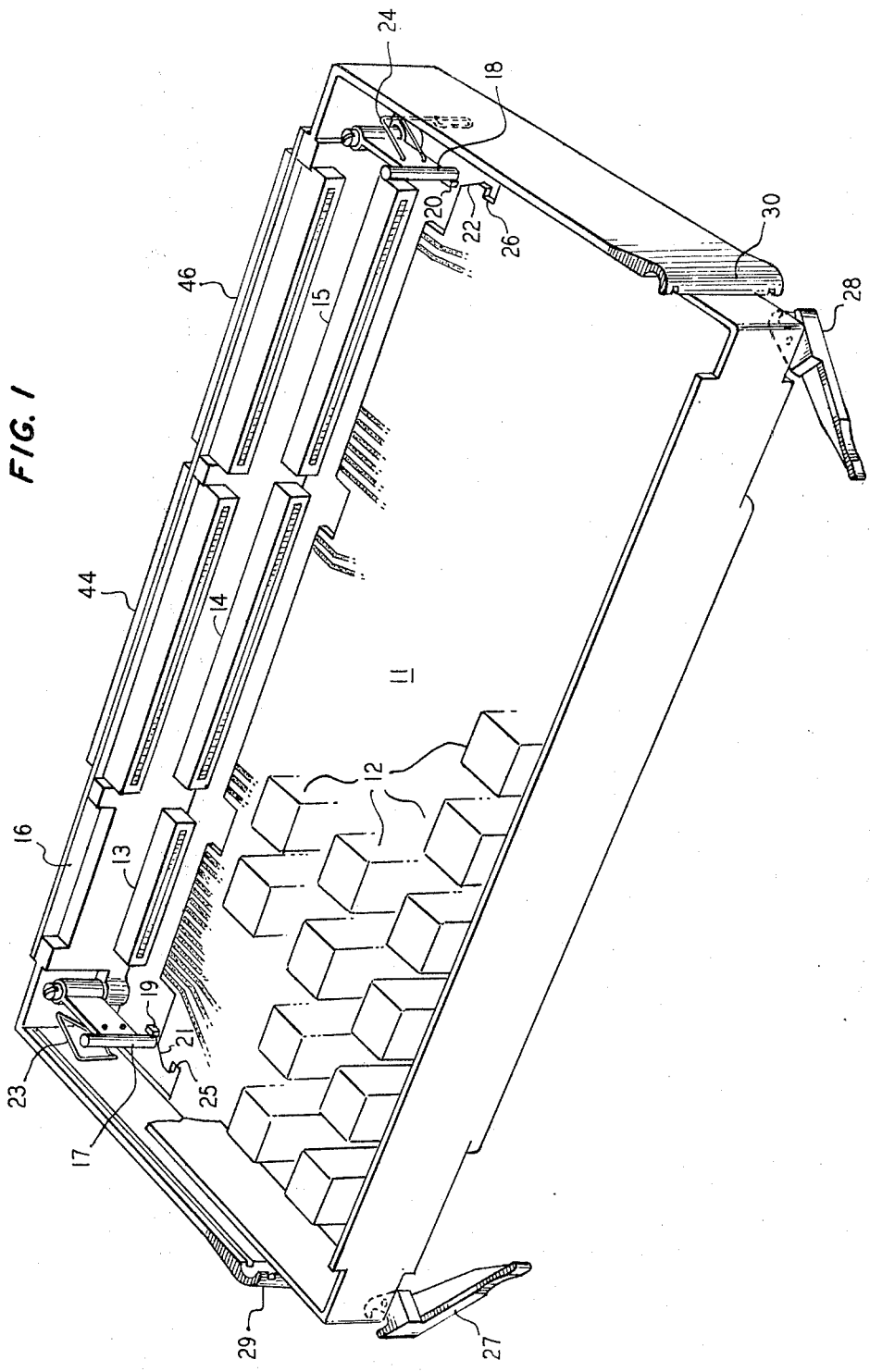
FIG. 1 illustrates a circuit board and associated connecting arrangement employing the inventive interlock.

FIG. 1 illustrates printed circuit board 11 including components 12 interconnected by printed wiring and adapted to mate with connectors 13-15. When board 11 is initially inserted into connectors 13-15, pivotally mounted spring loaded locking pins 17 and 18, which are shown resting against stops 19 and 20, are forced apart by tapered edges 21 and 22 on board 11 compressing springs 23 and 24. Pins 17 and 18 slide along edges 21 and 22 as board 11 is being inserted and finally rest in notches or detents 25 and 26 after the board is fully inserted in connectors 13-15. Connectors 13-15 are mounted on circuit board 16. The cooperation of the spring loaded locking pins in engaging the two inner corners of board 11 provides a locking or latching arrangement to prevent the removal of the board from its associated connectors. Although two locking pins are used here, only one appropriately located pin could provide the advantages of the invention. Furthermore, more than two such locking pins may also be employed if desired. For facility in inserting and removing board 11, ejector levers 27 and 28 multiply and control mechanical force by gripping and pivoting on ends 29 and 30 of side walls which form a rack or card cage enclosure.

Figure 2:
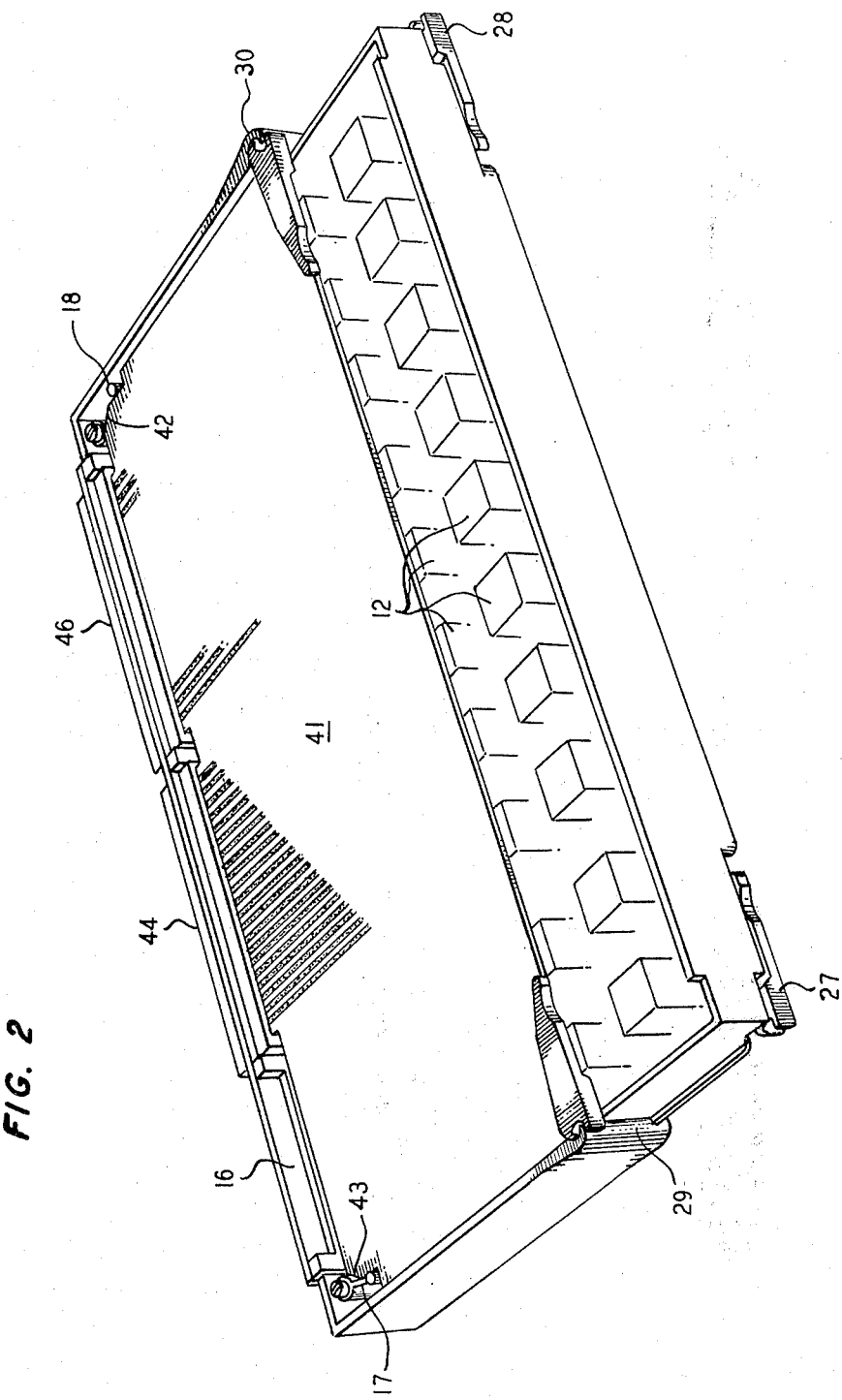
FIG. 2 depicts a circuit board for releasing the interlock of FIG. 1.

FIG. 2 illustrates the means required for unlocking circuit board 11 from connectors 13-15. As may be apparent in FIG. 2, circuit board 11 is permitted to be removed by virtue of the insertion of circuit board 41. In particular, as circuit board 41 is being inserted its wedgelike corners 42 and 43 produce further lateral separation between locking pins 17 and 18. The displacement of locking pins 17 and 18 is sufficient to remove them from notches 25 and 26 of board 11 (not shown in FIG. 2). This displacement action permits the removal of circuit board 11. It should also be pointed out that circuit board 41 now mates with connectors 44 and 46 shown in FIG. 1 which are interconnected with connectors 14 and 15 via the printed wiring (not shown) on back plane circuit board 16. This electrical interconnection enables circuit board 41 to provide the desired status of circuitry as circuit board 11 is removed.

FIGS. 3 and 4 depict a corner portion of the circuit boards shown in FIGS. 1 and 2 to illustrate the respective locations of locking pin 18. Of course, locking pin 17 operates in a similar manner by moving in the opposite direction. In FIG. 3, locking pin 18 secures circuit board 11 when fully inserted due to its seated position in notch 26. The pressure of spring 24, which is under compression, holds locking pin 18 in place. Accordingly, board 11 is locked in place while being inserted into its connectors. In FIG. 4, board 41 is also inserted into its connector socket and is located in a position over board 11. Notch 26, shown in phantom since it is underneath board 41, illustrates the mechanical movement of pin 18 due to the insertion of circuit board 11. Specifically, pin 18 is removed from notch 26 to permit the extraction of circuit board 11 from its connectors.

Lever ejectors 28 and 47 aid in the removal and insertion of their respective circuit boards.

FIG. 5 clearly illustrates the geometrical shape of locking pin 18. Screw 51 provides the pivot for the arcuate motion of the locking pin which places spring 24 in compression as circuit boards are inserted. On pin 18, tip 53 engages with the corner of circuit board 11 which includes notch 26. Upper tip 54 engages a similarly located corner but on circuit board 41.

FIG. 6 illustrates a typical circuit application for the inventive arrangement. It should be understood that the inventive principles, however, are suitable for a variety of other possible applications. In FIG. 6, customer equipment 61 is connected to central office 62 via a transmission circuit, such as a telephone trunk whose transmission path typically includes distribution frame 63 and access unit 64 associated with test apparatus 65. Test apparatus 65 is used to maintain the operational status of the transmission circuit through access unit 64 which may be dedicated for use with customer equipment 61. In this particular application, transmission relay 71 normally provides circuit continuity for both tip and ring sides of a 2-wire circuit or 4-wire circuit simplistically indicated by normally closed contact 72. Transmission relay 71 has the capability of splitting the transmission circuit and then bridging across the customer side or the central office side by appropriate operation of additional contacts 73 and 74 under the control of test apparatus 65. In this application, circuit board 11 includes transmission relay 71 as well as several other relays.

It would be highly desirable, in this situation, to test the operation of the transmission relays as well as their associated circuit board without disrupting the service provided to customer equipment 61. Circuit board 41 preserves the transmission integrity of FIG. 6 by requiring its insertion before permitting removal of circuit board 11. Therefore upon insertion, circuit board 41 provides the desired circuit continuity while moving the locking pins to allow the removal of circuit board 11 for testing it separately as a unit. The circuitry which couples test apparatus 65 to circuit board 11 utilizes connector 13 (shown in FIG. 1) which need not be duplicated for circuit board 41 since it simply provides continuity. If it is desired that board 41 provide all the features of board 11 both would require corresponding connections. It is stressed that this application is only one of several possible applications wherein a removal of one circuit board requires the insertion of another circuit board which is capable of providing a desired circuitry status while the first circuit board is removed.

Although the inventive principles have been disclosed in the context of an application in telephony, the advantages obtained by utilization of the inventive principles readily pertain to a variety of numerous other applications. In these other applications, it may be desirable that both circuit boards are identical or that the circuit board normally in place simply provides desired circuit continuity. The foregoing statement is also applicable to the present application where the inventive principles are used to advantage. Furthermore, the connectors need not have identical or duplicated electrical connections and may each be tailored to the particular circuit board to which it mates. Additionally, more than one circuit board may be locked in place to be unlocked by one or more circuit boards. Also, the locking or latching pins may be readily located at any point or positions on the circuit board rather than at opposite inner corners.

What is claimed is:
1. An interlocking arrangement comprising:
   a first planar pluggable element and a first plug-in connector, the arrangement preventing removal of the first planar pluggable element from the first plug-in connector;
   locking means for preventing the removal of the first planar pluggable element after insertion into the plug-in connector;
   auxiliary connector means in circuit with the plug-in connector adapted to receive a planar pluggable element; and
   unlocking means comprising a second planar pluggable element adapted to mate with the auxiliary connector means and interacting with the locking means to free the first planar pluggable element to allow its removal from the first plug-in connector while maintaining a predetermined circuit status for the first plug-in connector irrespective of the removal of the first planar pluggable element.

2. The interlock arrangement according to claim 1 wherein the first planar pluggable element includes a detent for engaging said locking means when inserted in the plug-in connector.

3. The interlock arrangement according to claim 2 wherein said locking means comprises a spring loaded pivoting lever having an end for sliding against the peripheral edge of a portion of the first planar pluggable element including the detent.

4. The interlock arrangement according to claim 3 wherein the second planar pluggable element includes a tapered portion for moving the end of the pivoting lever out of the detent when inserted into the auxiliary connector means.

5. The interlock arrangement according to claim 4 wherein the locking means comprises a second spring loaded pivoting lever and a second detent on the first planar pluggable element and the second spring loaded pivoting lever being adapted to engage the second detent.

6. An interlocking arrangement for preventing the interruption of continuity of selected circuits, the interlocking arrangement comprising:
   a pair of connectors in circuit with one another, each connector being adapted to receive a printed circuit board,
   cam lever means associated with the pair of connectors and adapted to engage a printed circuit board upon insertion into a connector,
   a printed circuit board adapted to mate with either of said connectors, said printed circuit board providing circuit continuity between selected terminals of its connector and having a detent thereon to provide a resting place for said cam lever means when fully inserted in one of said connectors, the detent serving to lock the printed circuit board in said connector by preventing its removal thereby maintaining the circuit continuity, and
   a second printed circuit board adapted to mate with either of said connectors and having a geometrical configuration which disengages said cam lever means from the detent when inserted into the other one of said connectors, said second printed circuit board capable of providing the circuit continuity of the selected circuits while enabling the removal of the other printed circuit board.

* * * * *